(12) United States Patent
Jung et al.

(10) Patent No.: US 10,937,931 B2
(45) Date of Patent: Mar. 2, 2021

(54) LIGHT EMITTING DEVICE

(71) Applicant: SAMSUNG ELECTRONICS CO., LTD., Suwon-si (KR)

(72) Inventors: Do-Gyu Jung, Suwon-si (KR); Sung-Woo Choi, Suwon-si (KR); Chul-Soo Yoon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/351,616

(22) Filed: Mar. 13, 2019

(65) Prior Publication Data

US 2020/0091379 A1 Mar. 19, 2020

(30) Foreign Application Priority Data

Sep. 18, 2018 (KR) .......................... 10-2018-0111831

(51) Int. Cl.
*H01L 33/50* (2010.01)
*C09K 11/77* (2006.01)
*H01L 33/60* (2010.01)

(52) U.S. Cl.
CPC ........ *H01L 33/502* (2013.01); *C09K 11/7715* (2013.01); *H01L 33/60* (2013.01)

(58) Field of Classification Search
CPC .... H01L 33/502; H01L 33/60; C09K 11/7715
USPC .................. 257/98, 84, 88, 95, 101, E27.12, 257/E33.056, E33.059, E33.06, E33.061, 257/E33.074, E21.001, E21.476, E21.53; 313/45, 483, 498, 503, 512; 438/16, 22, 438/26, 27, 29, 33
See application file for complete search history.

(56) References Cited

U.S. PATENT DOCUMENTS

| | | | |
|---|---|---|---|
| 7,859,000 B2 | 12/2010 | Chakraborty | |
| 8,101,443 B2 | 1/2012 | Chakraborty | |
| 8,338,204 B2 * | 12/2012 | Kim | .................... H01L 33/0079 438/33 |
| 8,865,022 B2 | 10/2014 | Tsukatani et al. | |
| 9,112,123 B2 | 8/2015 | Aoki et al. | |
| 9,472,731 B2 | 10/2016 | Tsukatani et al. | |
| 9,991,427 B2 * | 6/2018 | van de Ven | ........... H01L 33/505 |
| 2004/0130264 A1 * | 7/2004 | Liu | ..................... C09K 11/7774 313/512 |
| 2007/0023763 A1 * | 2/2007 | Takigawa | ................ H01L 33/22 257/79 |

(Continued)

FOREIGN PATENT DOCUMENTS

| | | |
|---|---|---|
| JP | 2009-0026873 A | 2/2009 |
| JP | 2011-0124393 A | 6/2011 |
| KR | 10-2016-0094633 A | 8/2016 |

*Primary Examiner* — Dao H Nguyen
(74) *Attorney, Agent, or Firm* — Lee IP Law, P.C.

(57) ABSTRACT

A light emitting device including a light emitting element for emitting blue light; and a fluorescent film including a single crystal fluorescent material or a polycrystalline fluorescent material, wherein the fluorescent film absorbs the blue light and emits light having a wavelength different from that of the blue light, wherein the fluorescent film faces a surface of the light emitting element, and the fluorescent material included in the fluorescent film is represented by the following Formula (1):

$$Y_{3-x-y}L_xM_yAl_5O_{12}$$

wherein L is Gd or Lu, and M is Ce, Tb, Eu, Yb, Pr, Tm, or Sm, $0 \leq x \leq 2.999$, and $0.001 \leq y \leq 0.1$.

17 Claims, 20 Drawing Sheets

(56) References Cited

U.S. PATENT DOCUMENTS

| | | | |
|---|---|---|---|
| 2007/0103057 A1* | 5/2007 | Sohn | C09K 11/7792 |
| | | | 313/503 |
| 2007/0268694 A1* | 11/2007 | Bailey | G02B 27/0955 |
| | | | 362/231 |
| 2008/0283864 A1* | 11/2008 | LeToquin | H01L 33/505 |
| | | | 257/101 |
| 2009/0212257 A1* | 8/2009 | Sohn | B32B 27/08 |
| | | | 252/301.36 |
| 2010/0142189 A1* | 6/2010 | Hong | C09K 11/616 |
| | | | 362/97.3 |
| 2010/0163898 A1* | 7/2010 | Hung | H01L 33/507 |
| | | | 257/98 |
| 2011/0108875 A1* | 5/2011 | Takenaka | H01L 33/44 |
| | | | 257/98 |
| 2012/0175559 A1* | 7/2012 | Tsukatani | C01F 17/34 |
| | | | 252/301.4 R |
| 2015/0083967 A1* | 3/2015 | Watanabe | C30B 15/00 |
| | | | 252/301.4 R |
| 2016/0043289 A1 | 2/2016 | Inomata et al. | |
| 2016/0056347 A1* | 2/2016 | Kubat | H01L 33/32 |
| | | | 257/76 |
| 2016/0240748 A1* | 8/2016 | Inomata | H01L 33/502 |
| 2017/0234506 A1* | 8/2017 | Lee et al. | G06Q 10/063112 |
| 2018/0053882 A1* | 2/2018 | Cheng | H01L 33/58 |
| 2018/0122996 A1* | 5/2018 | He | H01L 33/486 |
| 2018/0138374 A1 | 5/2018 | Funayama et al. | |

* cited by examiner

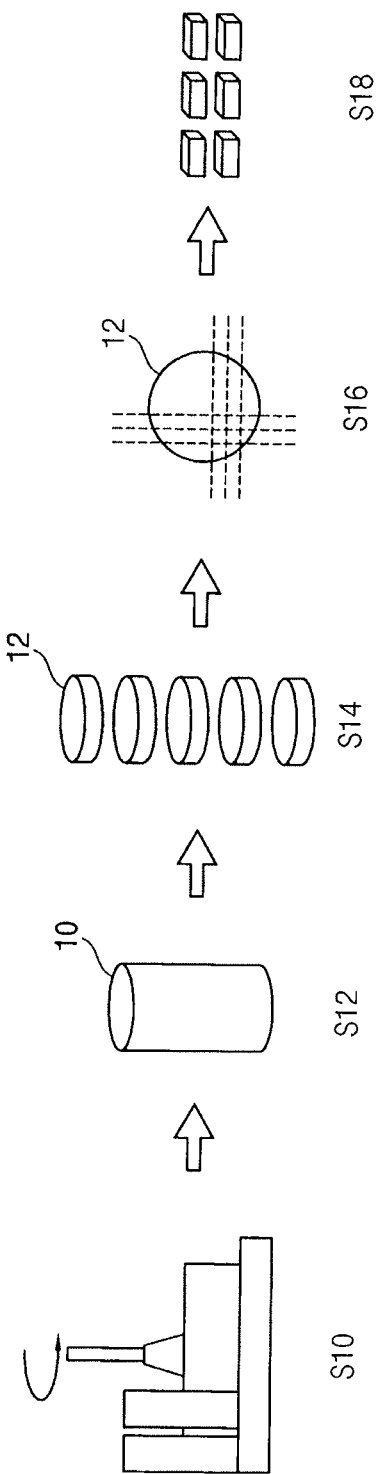

LIGHT EMITTING DEVICE

CROSS-REFERENCE TO RELATED APPLICATION

Korean Patent Application No. 10-2018-0111831, filed on Sep. 18, 2018 in the Korean Intellectual Property Office (KIPO), and entitled: "Light Emitting Device," is incorporated by reference herein in its entirety.

BACKGROUND

1. Field

Embodiments relate to a light emitting device.

2. Description of the Related Art

A light emitting device may include a blue light emitting element and a yellow phosphor structure. A blue light emitted from the blue light emitting element and a yellow light from the yellow phosphor structure (being excited by the blue light) may be combined to emit white light.

SUMMARY

The embodiments may be realized by providing a light emitting device including a light emitting element for emitting blue light; and a fluorescent film including a single crystal fluorescent material or a polycrystalline fluorescent material, wherein the fluorescent film absorbs the blue light and emits light having a wavelength different from that of the blue light, wherein the fluorescent film faces a surface of the light emitting element, and the fluorescent material included in the fluorescent film is represented by the following Formula (1):

$$Y_{3-x-y}L_xM_yAl_5O_{12}$$

wherein L is Gd or Lu, and M is Ce, Tb, Eu, Yb, Pr, Tm, or Sm, $0 \le x \le 2.999$, and $0.001 \le y \le 0.1$.

The embodiments may be realized by providing a light emitting device including a light emitting element for emitting blue light; and a single crystal fluorescent material, the single crystal fluorescent material including an encapsulant and a single crystal fluorescent powder, wherein the single crystal fluorescent material absorbs the blue light and emits light having a wavelength different from that of the blue light, and wherein the single crystal fluorescent material faces a surface of the light emitting element, and particles of the single crystal fluorescent powder have a quartile deviation (QD) less than 2.0, and wherein particles of the single crystal fluorescent powder are represented by the following Formula (1):

$$Y_{3-x-y}L_xM_yAl_5O_{12}$$

wherein L is Gd or Lu, and M is Ce, Tb, Eu, Yb, Pr, Tm, or Sm, $0 \le x \le 2.999$, and $0.001 \le y \le 0.1$.

The embodiments may be realized by providing a light emitting device including a light emitting element for emitting blue light; a fluorescent film including a single crystal fluorescent material or a polycrystalline fluorescent material, the fluorescent film contacting an upper surface of the light emitting element, wherein the fluorescent film absorbs the blue light and emits light having a wavelength different from that of the blue light; and a reflection plate attached on a sidewall of the light emitting element and a sidewall of the fluorescent film, wherein the single crystal fluorescent material or polycrystalline fluorescent material included in the fluorescent film is represented by the following Formula (1):

$$Y_{3-x-y}L_xM_yAl_5O_{12}$$

wherein L is Gd or Lu, and M is Ce, Tb, Eu, Yb, Pr, Tm, or Sm, $0 \le x \le 2.999$, and $0.001 \le y \le 0.1$.

BRIEF DESCRIPTION OF THE DRAWINGS

Features will be apparent to those of skill in the art by describing in detail exemplary embodiments with reference to the attached drawings in which:

FIG. 1 illustrates stages in a method of manufacturing a single crystal fluorescent film device in accordance with example embodiments;

DETAILED DESCRIPTION

Single Crystal Fluorescent Film

Figure 2A:
FIGS. 2A to 2D illustrate cross-sectional views of fluorescent films in accordance with example embodiments.

In an implementation, a single crystal fluorescent film may include a single crystal phosphor compound represented by Formula 1.

$$Y_{3-x-y}L_xM_yAl_5O_{12} \qquad <\text{Formula 1}>$$

In Formula 1, L may be, e.g., Gd or Lu, and M may be, e.g., Ce, Tb, Eu, Yb, Pr, Tm, or Sm, and x and y may satisfy the following relations: $0 \le x \le 2.999$ and $0.001 \le y \le 0.1$.

The single crystal fluorescent film may not include a grain boundary therein.

In an implementation, the single crystal fluorescent film may emit light having a peak intensity at a wavelength of, e.g., 500 nm to 600 nm. For example, the single crystal fluorescent film may emit a light in a range of the green light region to the yellow light region. The peak intensity wavelength of the single crystal fluorescent film may vary according to the composition of the M (in Formula 1). For example, when the M includes Ce, it may be excited by excitation light to emit yellow light (e.g., having a wavelength of about 560 nm). In an implementation, when the M includes Eu, it may emit green light (e.g., having a wavelength of about 500 nm).

FIG. 1 illustrates stages in a method of manufacturing a single crystal fluorescent film device in accordance with example embodiments.

Referring to FIG. 1, a single crystal phosphor ingot 10 may be obtained. (S10 and S12)

In an implementation, the single crystal phosphor ingot 10 may be formed by liquid growth method, e.g., a CZ method (Czochralski method), an EFG method (Edge Defined Film Fed Growth Method), a Bridgeman's method, a FZ (Floating Zone) method, a Bernoulli's method, etc.

As a method for forming the single crystal phosphor ingot 10 by the CZ method, a raw material mixture may be prepared. The raw material mixture may include a compound of materials included in a phosphor. The raw material mixture may be a mixture of powders, e.g., $Y_2O_3$, $CeO_2$, and $Al_2O_3$. The raw material mixture may be put in a crucible made of iridium, and may be melted to obtain a molten liquid. For example, a seed crystal which is a YAG single crystal may be prepared. A tip of the seed crystal may contact the molten liquid, and then may be pulled up while being rotated to form the single crystal phosphor ingot 10.

The single crystal phosphor ingot 10 may include a material of Formula 1 substantially the same as the material of the single crystal phosphor described above.

The single crystal phosphor ingot 10 may be sliced in a horizontal direction so that a wafer-shaped single crystal phosphor 12 may be formed. (S14)

A dicing process for cutting the wafer-shaped single crystal phosphor 12 and a surface treatment such as grinding and polishing, etc., may be performed to form a single crystal fluorescent film having a desired structure. (S16, S18) The single crystal fluorescent film may be formed to have a suitable shape for used in each of light emitting devices.

Polycrystalline Fluorescent Film

In an implementation, a polycrystalline fluorescent film may include a polycrystalline phosphor compound represented by Formula 1.

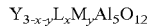
<Formula 1>

In Formula 1, L may be, e.g., Gd or Lu, and M may be, e.g., Ce, Tb, Eu, Yb. Pr, Tm, or Sm, and x and y may satisfy the following relations: $0 \leq x \leq 2.999$ and $0.001 \leq y \leq 0.1$.

Single crystal phosphors may be merged to form one polycrystalline phosphor, and the polycrystalline fluorescent film may include polycrystalline phosphors. For example, the polycrystalline fluorescent film may include a grain boundary between the polycrystalline phosphors.

The polycrystalline fluorescent film may be synthesized and dispersed in a nano-sized phosphor, and then it may be compressed and sintered by a high-pressure, high-temperature sintering method, or a high-temperature vacuum sintering method to form a polycrystalline phosphor ingot. The polycrystalline phosphor ingot may consist of the material of Formula 1.

The polycrystalline phosphor ingot may be sliced in the horizontal direction, so that a wafer-shaped polycrystalline phosphor may be formed.

A dicing process for cutting the wafer-shaped single crystal phosphor 12 to obtain a target size and a surface treatment such as grinding and polishing, etc., may be performed to form a polycrystalline fluorescent film having a desired structure.

The single crystal fluorescent film or the polycrystalline fluorescent film may be formed to have a suitable shape for used in each of light emitting devices.

Hereinafter, although only the single crystal fluorescent film may be described, however the polycrystalline fluorescent film may be applied in the same manner as the single crystal fluorescent film.

FIGS. 2A to 2D illustrate cross-sectional views of fluorescent films in accordance with example embodiments.

Referring to FIG. 2A, the single crystal fluorescent film 14 may have a flat plate shape with a flat upper surface and a flat lower surface. The single crystal fluorescent film 14 may be manufactured by cutting of the wafer shaped single crystal phosphor 12 to have a target size.

Figure 2B:
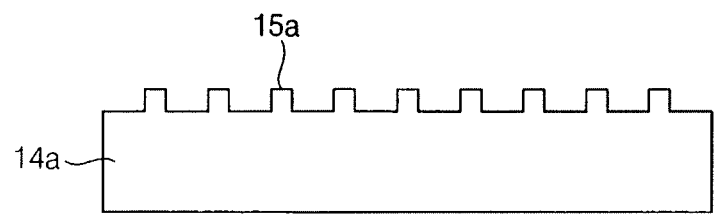
Figure 2C:
Figure 2D:
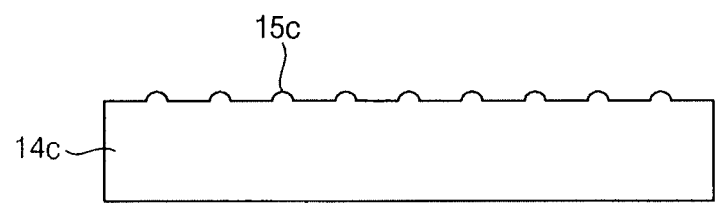

In an implementation, as shown in FIGS. 2B to 2D, each of the single crystal fluorescent films 14a, 14b, and 14c may include protruding patterns 15a, 15b, and 15c on a surface (e.g., an upper surface) thereof.

For example, the upper surface may be a surface of the film on or from which light may be emitted. The single crystal fluorescent films 14a, 14b, and 14c may have repeatedly and regularly arranged protruding patterns 15a, 15b, and 15c. In an implementation, each of the protruding patterns 15a, 15b, and 15c may have a radially extending shape, a straight line and a space repetition shape or an embossed shape, etc.

The wafer shaped single crystal phosphor 12 may be diced to have a target size, and a texturing process may be performed on an upper surface thereof. Thus, the protruding patterns 15a, 15b, and 15c may be formed on the upper surface of each of the single crystal fluorescent films 14a, 14b and 14c. The texturing process may include, e.g., etching, laser cutting, planing, grinding, sandblasting, etc.

In an implementation, a height and a width of each of the protruding patterns 15a, 15b and 15c may be in a range of about 0.5 µm to about 5 µm. In an implementation, a distance between the protruding patterns 15a, 15b and 15c may be in a range of about 0.5 µm to about 5 µm. As the protruding patterns 15a. 15b, and 15c are formed, a reflection direction of light may be switched at a surface of each of the single crystal fluorescent films 14a, 14b, and 14c. Therefore, light loss due to a total reflection in each of the single crystal fluorescent films 14a, 14b, and 14c may be advantageously reduced.

Cross-sectional shapes of the protruding patterns 15a, 15b, and 15c may include suitable shapes. For example, as shown in FIG. 2B, the cross-sectional shape of the protruding pattern 15a may be a rectangle. As shown in FIG. 2C, the cross-sectional shape of the protruding pattern 15b may be triangular. As shown in FIG. 2D, the cross-sectional shape of the protruding pattern 15c may be semi-circular. In an implementation, surfaces of the protruding patterns may have irregular roughness.

FIGS. 3A to 3D illustrate cross-sectional views of fluorescent films in accordance with example embodiments.

Figure 3A:
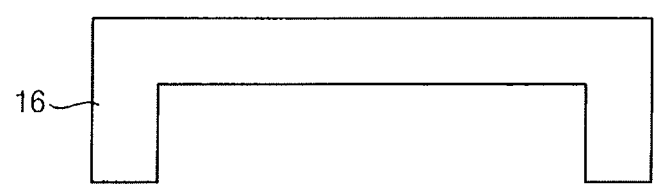
FIGS. 3A to 3D illustrate cross-sectional views of fluorescent films in accordance with example embodiments.

Referring to FIG. 3A, the single crystal fluorescent film 16 may have a cup shape including an inner space. In an implementation, a blue light emitting element may fill in the inner space of the cup-shaped single crystal fluorescent film 16.

A dicing process of the wafer-shaped single crystal phosphor 12 and an etching process or a cutting process thereof may be performed to form the cup-shaped single crystal fluorescent film.

Figure 3B:
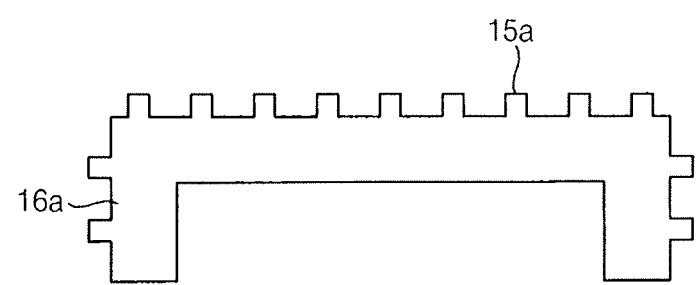
Figure 3C:
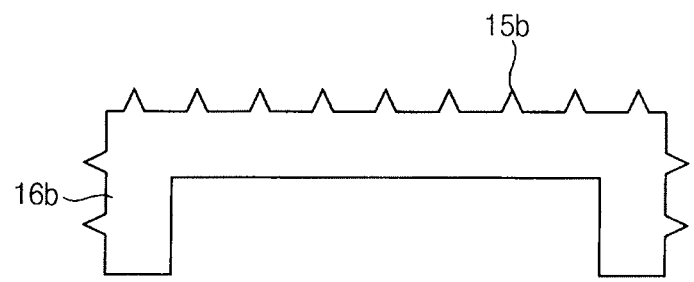
Figure 3D:
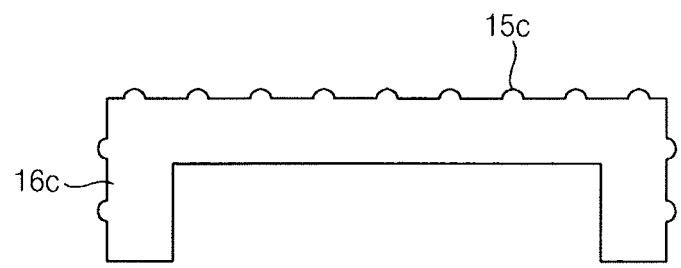

Referring to FIGS. 3B to 3D, a surface (e.g., upper surface) from which light may be emitted from each of the single crystal fluorescent films 16*a*, 16*b*, and 16*c* may have protruding patterns 15*a*, 15*b*, and 15*c*.

In an implementation, the protruding patterns 15*a*, 15*b*, and 15*c* pattern may not be formed on the surface corresponding to an outer sidewall of a cup-shaped portion of each of the single crystal fluorescent films, and may be only formed on the upper surface, (e.g., or bottom surface if inverted) of the cup-shaped portion of each of the single crystal fluorescent films.

In an implementation, as shown in FIGS. 3B to 3D, cross-sectional shapes of the protruding patterns 15*a*, 15*b*, and 15*c* may be a rectangle, a triangle, and a semi-circle, respectively.

Figure 4A:
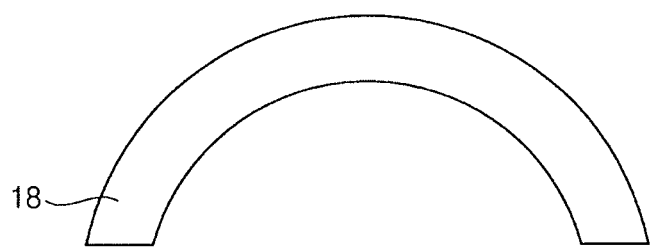
FIGS. 4A to 4D illustrate cross-sectional views of fluorescent films in accordance with example embodiments.

FIGS. 4A to 4D illustrate cross-sectional views of fluorescent films in accordance with example embodiments. Referring to FIG. 4A, the single crystal fluorescent film 18 may have an upper surface and a lower surface having a hemi-spherical shape. For example, the single crystal fluorescent film 18 may include a hemi-spherical inner space. In an implementation, a lens may be formed in the inner space of the single crystal fluorescent film 18.

A dicing process of the wafer-shaped single crystal phosphor, an etching process or a cutting process of thereof and a grinding process may be performed to form the single crystal fluorescent film 18.

Figure 4B:
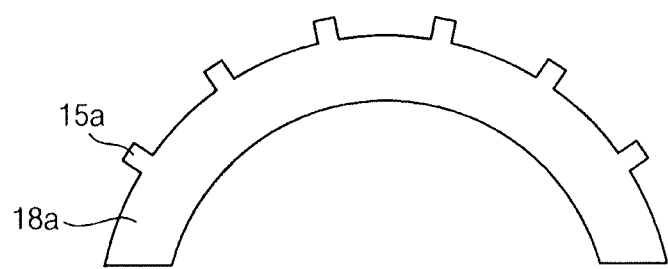
Figure 4C:
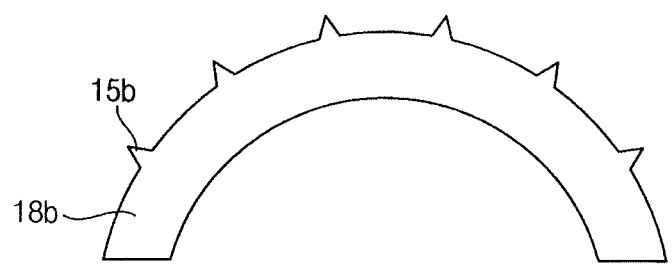
Figure 4D:
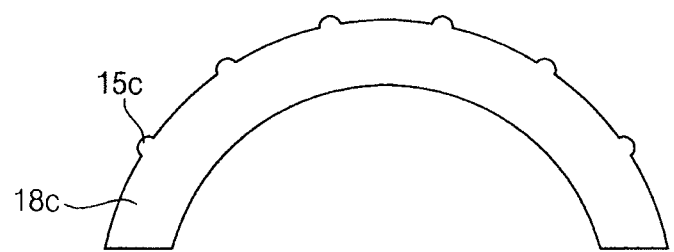

Referring to FIGS. 4B to 4D, an upper surface (from which light may be emitted from each of the single crystal fluorescent films 18*a*, 18*b*, and 18*c*) may have protruding patterns 15*a*, 15*b*, and 15*c* thereon. In an implementation, as shown in FIGS. 4B to 4D, cross-sectional shapes of the protruding patterns 15*a*, 15*b*, and 15*c* may be a rectangle, a triangle, and a semi-circle, respectively.

In an implementation, an anti-reflection coating layer may be further formed on the upper surface of each of the single crystal fluorescent films. The anti-reflection coating layer may include a material having a refractive index that is between a refractive index of the single crystal fluorescent film and a refractive index of air. The anti-reflection coating layer may be formed for a refractive index matching between the single crystal fluorescent film and air. As the anti-reflection coating layer is formed, a light emitted from each of the single crystal fluorescent films may increase. Thus, an emitting efficiency of each of the single crystal fluorescent films may increase. In an implementation, the anti-reflection coating layer may have the refractive index of about 1.3 to about 1.5. The anti-reflection coating layer may include, e.g., $BaF_2$, $CaF_2$, $DyF_2$, $MgF_2$, $SiO_2$, $Na_3AlF_6$, $Na_3Al_3F_{14}$, or the like. The anti-reflection coating layer may be formed on the single crystal fluorescent film by performing a spin coating, a deposition process or a sputtering process. In an implementation, when the anti-reflection coating layer is formed on the single crystal fluorescent film including the protruding patterns, the anti-reflection coating layer may be conformally formed on the surface of the protrusion patterns.

Hereinafter, embodiments of a light emitting device including the single crystal fluorescent film or the polycrystalline fluorescent film in accordance with example embodiments may be described. Although only the single crystal fluorescent film may be described, however the polycrystalline fluorescent film may be applied in the same manner as the single crystal fluorescent film.

A light emitting device including a fluorescent film

Figure 5A:
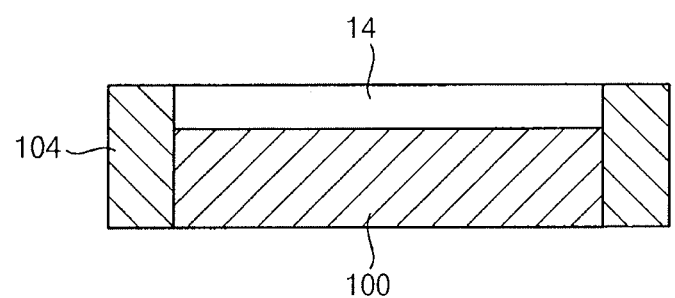
FIGS. 5A to 5G illustrate cross-sectional views of light emitting devices in accordance with example embodiments.
Figure 5B:
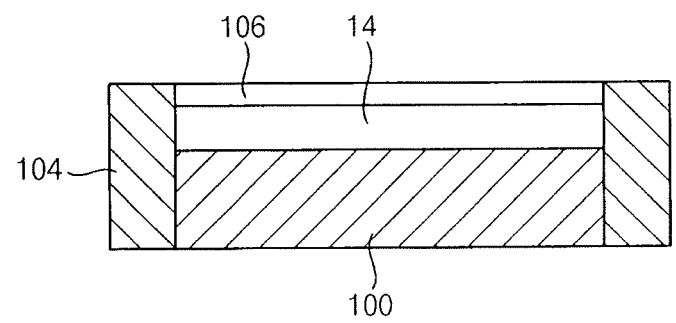
Figure 5C:
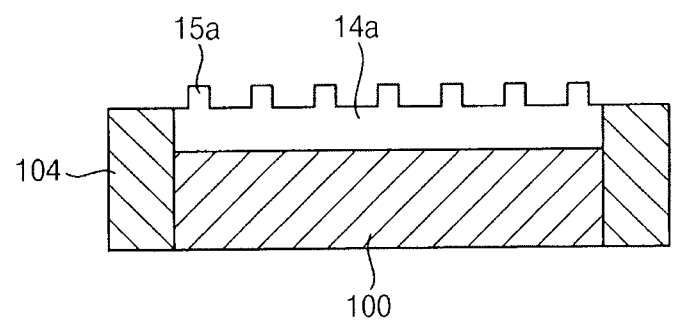

FIG. 5A illustrates a cross-sectional view of a light emitting device in accordance with example embodiments. FIGS. 5B and 5C illustrate cross-sectional views illustrating light emitting devices in accordance with example embodiments.

Referring to FIG. 5A, the light emitting device may include a light emitting element 100 and a single crystal fluorescent film 14. The light emitting element 100 may emit blue light. The single crystal fluorescent film 14 may absorb the blue light (e.g., emitted by the light emitting element 100) and may emit light of a wavelength different from wavelength of the blue light. The single crystal fluorescent film 14 may include a single crystal phosphor. In an implementation, the light emitting device may further include a reflection plate 104.

The light emitting element 100 may be an LED chip. In an implementation, the light emitting element 100 may include an n-type semiconductor layer including a GaN doped with n-type impurities, a light emitting layer, and a p-type semiconductor layer including a GaN doped with p-type impurities sequentially formed on a substrate including, e.g., sapphire or the like. A peak wavelength (e.g., wavelength of peak intensity) of an emitting light from the light emitting element 100 may be in a range of about 430 nm to about 480 nm. An upper surface of the light emitting element 100 may be a light emitting surface.

The single crystal fluorescent film 14 may be on the upper surface of the light emitting element 100. In an implementation, the single crystal fluorescent film 14 may completely cover the upper surface of the light emitting element 100. For example, the light emitting element 100 and the single crystal fluorescent film 14 may have a stacked structure. In an implementation, the single crystal fluorescent film 14 may be the same as that illustrated with reference to FIG. 2A. For example, upper and lower surfaces of the single crystal fluorescent film 14 may be flat. In an implementation, a sidewall of the single crystal fluorescent film 14 may have a vertical inclination (e.g., may be vertical or orthogonal) with respect to the upper and lower surfaces of the single crystal fluorescent film 14.

The single crystal fluorescent film 14 may not include a grain boundary, and light scattering in the single crystal fluorescent film 14 may be reduced. The single crystal fluorescent film 14 may absorb light emitted from the light emitting element 100, and may emit light having a peak intensity at a wavelength of 500 nm to 600 nm. For example, the single crystal fluorescent film 14 may absorb blue light emitted from the light emitting element 100, and may emit yellow light.

In an implementation, an adhesive layer may be between the light emitting element 100 and the single crystal fluorescent film 14, so that the light emitting element 100 and the single crystal fluorescent film may be bonded to each other. The adhesive layer may include, e.g., a silicone sealant, an epoxy, an organic adhesive, an inorganic adhesive, etc.

The reflection plate 104 may be attached on a sidewall of the light emitting element 100 and on the sidewall of the single crystal fluorescent film 14. The reflection plate 104 may reflect scattered light at the sidewall of the light emitting element 100 toward the single crystal fluorescent film 14. Thus, a reflected light may be emitted again to an outside through the single crystal fluorescent film 14, and an emitting efficiency of the light emitting device may increase. In an implementation, the reflection plate 104 may include a white silicone layer or a metal thin film. In an implementation, the reflection plate 104 may be attached to the sidewall of the light emitting element 100 and the sidewall of the single crystal fluorescent film 14 using an adhesive.

The single crystal fluorescent film 14 having a flat plate type may have a thermal conductivity higher than a thermal conductivity of a general fluorescent film including phosphors in a glass or a silicon film. For example, the single crystal fluorescent film 14 having a flat plate type may have a high thermal conductivity of about 9 W/mK to about 10 W/mK, so that the light emitting device including the single crystal fluorescent film 14 has a high heat radiation characteristic. Thus, the light emitting device having high power may be manufactured.

As described above, the light emitting device may include the single crystal fluorescent film 14 and the reflection plate 104 directly attached on the LED chip. Thus, the light emitting device may have a chip scale peak (CSP) structure having a size similar to a size of the LED chip.

Referring to FIG. 5B, the light emitting device may be substantially the same as that illustrated with reference to FIG. 5A. However, in the light emitting device, an anti-reflection coating layer 106 may be further coated on the single crystal fluorescent film 14. By including the anti-reflection coating layer 106, an emitting efficiency of the light emitting device may increase.

The anti-reflection coating layer 106 may include a material having a refractive index between a refractive index of the single crystal fluorescent film 14 and a refractive index of air. For example, the anti-reflection coating layer 106 may have a refractive index of about 1.3 to about 1.5. The anti-reflection coating layer 106 may include, e.g., a silicon oxide or $MgF_2$.

Referring to FIG. 5C, the light emitting device may be substantially the same as that illustrated with reference to FIG. 5A. However, in the light emitting device, an upper surface of a single crystal fluorescent film 14a (e.g., a surface facing away from the light emitting element 100) may include protruding patterns.

In an implementation, as illustrated in FIG. 5C, a cross-sectional shape of the protruding patterns may be a rectangle, as that illustrated with reference to FIG. 2B. In an implementation, the shapes of the cross-section of the protruding patterns may be a triangle or a semi-circular, respectively. For example, the single crystal fluorescent film including the protruding patterns may be one of those illustrated with reference to FIGS. 2C and 2D.

In an implementation, the protruding patterns 15a, 15b, 15c may have a radially extending shape, a straight line and a space repetition shape or an embossed shape, etc. In an implementation, an anti-reflection coating layer may be further included on the single crystal fluorescent film including the protruding pattern.

FIGS. 5D to 5G illustrate cross-sectional views of light emitting devices in accordance with example embodiments, respectively.

Each of the light emitting devices shown in FIGS. 5D to 5G includes a light emitting element 100, a single crystal fluorescent film 14 and a reflection plate 104, as those illustrated with reference to FIG. 5A. The light emitting element 100 may emit blue light. The single crystal fluorescent film 14 may absorb the blue light, and may emit light of a wavelength different from wavelength of the blue light. The single crystal fluorescent film 14 may include a single crystal phosphor. However, the single crystal fluorescent film and the reflection plate 104 may have shapes different from those of the light emitting device shown in FIG. 5A, respectively.

Figure 5D:
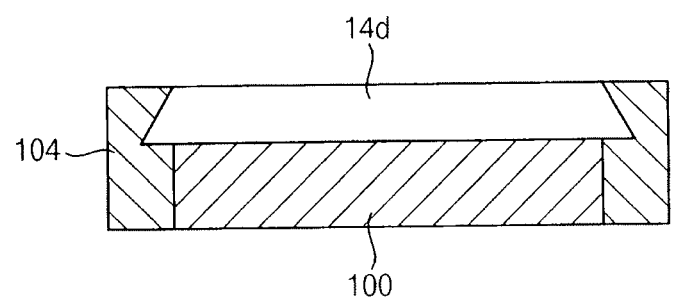

Referring to FIG. 5D, the single crystal fluorescent film 14d included in the light emitting device may completely cover the upper surface of the light emitting element 100. Upper and lower surfaces of the single crystal fluorescent film 14d may be flat. In an implementation, a sidewall of the single crystal fluorescent film 14d may have a constant inclination not perpendicular to the upper and lower surfaces of the single crystal fluorescent film 14d. For example, sidewalls of the single crystal fluorescent film 14d may be inclined such that the single crystal fluorescent film 14d has a trapezoidal cross sectional shape. For example, a size (e.g., area) of the upper surface of the single crystal fluorescent film 14d may be different from a size of the lower surface of the single crystal fluorescent film 14d. In an implementation, the size of the upper surface of the single crystal fluorescent film 14d may be smaller than the size of the lower surface of the single crystal fluorescent film 14d. An angle between a sidewall and the lower surface of the single crystal fluorescent film 14d may be an acute angle. Shapes of the single crystal fluorescent film 14d and the reflection plate 104 formed on the sidewall of the light emitting element 100 may vary depending on the shape of the sidewall of the single crystal fluorescent film 14d. In an implementation, an inner wall of the reflection plate 104 may be conformally formed along sidewall profiles of the single crystal fluorescent film 14d and the light emitting element 100. An outer wall of the reflection plate may have a vertical inclination (e.g., may be vertical or flat).

Figure 5E:
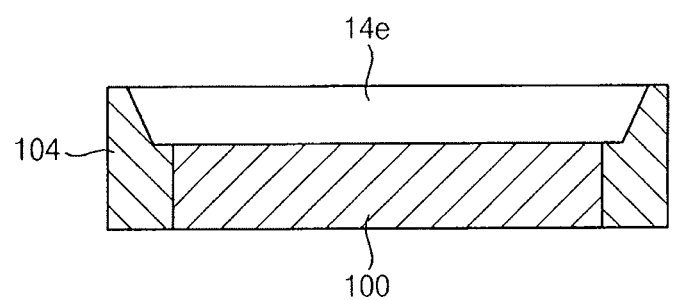

Referring to FIG. 5E, the light emitting device may be substantially the same as that illustrated with reference to FIG. 5A, except for an inclined direction of the sidewall of the single crystal fluorescent film 14e. For example, the sidewall of the single crystal fluorescent film 14e may have an inclination not perpendicular to (e.g., may be inclined relative to) the upper and lower surfaces. In an implementation, a size of the upper surface of the single crystal fluorescent film 14e may be greater than a size of the lower surface of the single crystal fluorescent film 14e because of the inclined sides. For example, an angle between the sidewall and the lower surface of the single crystal fluorescent film 14e may be an obtuse angle.

Figure 5F:
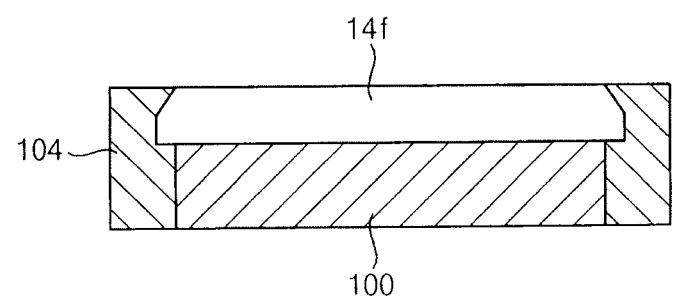

Referring to FIG. 5F, in the light emitting device, a lower sidewall and an upper sidewall of the single crystal fluorescent film 14f may have different inclinations.

In an implementation, the lower sidewall of the single crystal fluorescent film 14f may have a vertical inclination (e.g., may be orthogonal relative to the lower surface of the single crystal fluorescent film), and the upper sidewall of the single crystal fluorescent film 14f may have a non-vertical inclination (e.g., may be inclined relative to the lower sidewall and/or the upper surface). For example, sizes of the upper and lower surfaces of the single crystal fluorescent film 14f may be different from each other. In an implementation, the upper sidewall of the single crystal fluorescent film 14f may have an inclination (e.g., may be inclined) such that the size of the upper surface of the single crystal fluorescent film 14f is smaller than the size of the lower surface of the single crystal fluorescent film 14f. For example, an angle between the upper sidewall and the lower surface of the single crystal fluorescent film 14f may be an acute angle.

Figure 5G:
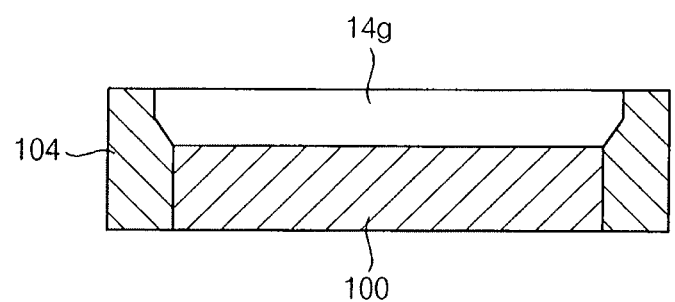

Referring to FIG. 5G, in the light emitting device, a lower sidewall and an upper sidewall of the single crystal fluorescent film 14g may have different inclinations.

In an implementation, the lower sidewall of the single crystal fluorescent film 14g may have a non-vertical inclination (e.g., may be inclined), and the upper sidewall of the single crystal fluorescent film 14g may have a vertical inclination (e.g., may extend vertically). For example, sizes of the upper and lower surfaces of the single crystal fluorescent film 14*g* may be different from each other. In an implementation, the lower sidewall of the single crystal fluorescent film 14*g* may be inclined such that the size of the upper surface of the single crystal fluorescent film 14*g* may be greater than the size of the lower surface. For example, an angle between the lower sidewall and the lower surface of the single crystal fluorescent film 14*g* may be an obtuse angle.

As described above, a sidewall shape of the single crystal fluorescent film may be variously changed, and thus a shape of the sidewall of the reflection plate may be changed.

In an implementation, in each of the light emitting devices shown in FIGS. 5D to 5G, an anti-reflection coating layer may be further formed to cover the upper surface of the single crystal fluorescent film, as similar to that shown in FIG. 5B.

In an implementation, in each of the light emitting devices shown in FIGS. 5D to 5G, the single crystal fluorescent film may include protruding patterns on the upper surface thereof, as similar to that shown in FIG. 5C.

Figure 6A:
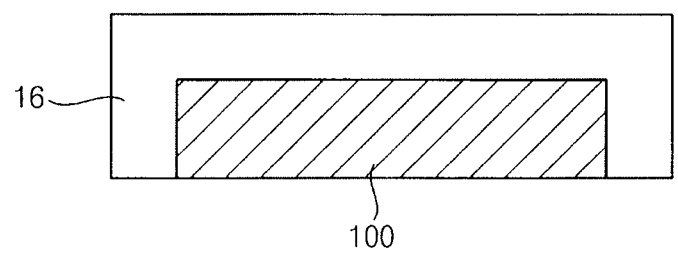
FIGS. 6A to 6C illustrate cross-sectional views of light emitting devices in accordance with example embodiments.
Figure 6B:
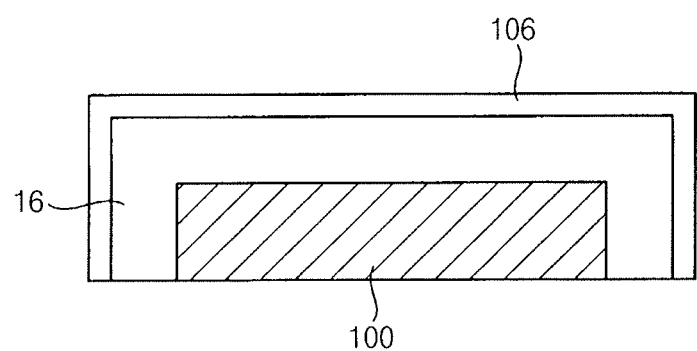
Figure 6C:
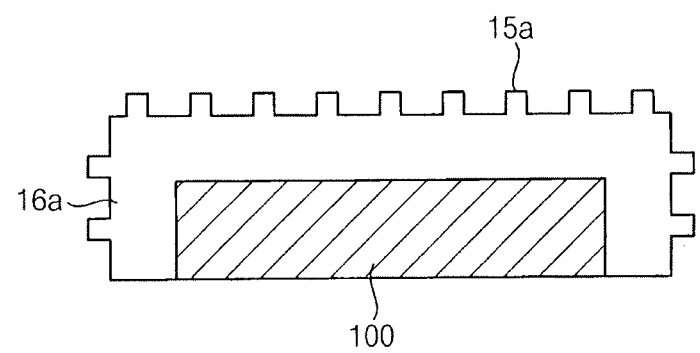

FIGS. 6A to 6C illustrate cross-sectional views of light emitting devices in accordance with example embodiments.

Referring to FIG. 6A, the light emitting device may include a light emitting element 100 and a single crystal fluorescent film 16 covering an upper surface and a sidewall of the light emitting element 100.

The light emitting element 100 may be substantially the same as that illustrated with reference to FIG. 5A.

The single crystal fluorescent film 16 may be formed on the upper surface and the sidewall of the light emitting element 100 to completely cover the upper surface and the sidewalls of the light emitting element 100.

In an implementation, the single crystal fluorescent film 16 may have a shape substantially the same as a shape illustrated with reference to FIG. 3A. For example, the single crystal fluorescent film 16 may have one body (e.g., monolithic) structure covering the upper surface and the sidewall of the light emitting element 100. The single crystal fluorescent film 16 may have a cup shape having an inner space in which the upper surface and the side wall of the light emitting element 100 may be housed or accommodated.

In an implementation, upper and lower surfaces of the single crystal fluorescent film may be flat, as illustrated with reference to FIG. 2A. In this case, the single crystal fluorescent films may be attached to the upper surface and the sidewall of the light emitting element 100, respectively.

In an implementation, an adhesive layer may be between the light emitting element 100 and the single crystal fluorescent film 16, and the light emitting element 100 and the single crystal fluorescent film 16 may be bonded to each other using the adhesive layer.

The single crystal fluorescent film 16 may have a high heat radiation characteristic, and the light emitting device having high power may be manufactured. Also, the light emitting device may have a chip scale peak (CSP) structure.

In an implementation, as shown in FIG. 6B, an anti-reflection coating layer 106 may be further formed on a surface of the single crystal fluorescent film 16 included in the light emitting device.

In an implementation, as shown in FIG. 6C, protruding patterns 15*a* may be further formed on a surface of the single crystal fluorescent film 16*a* included in the light emitting device. For example, the single crystal fluorescent film 16*a* may use one of those illustrated with reference to FIGS. 3B and 3D. In an implementation, an anti-reflection coating layer may be further formed on the single crystal fluorescent film 16*a* including the protruding patterns.

Figure 7A:
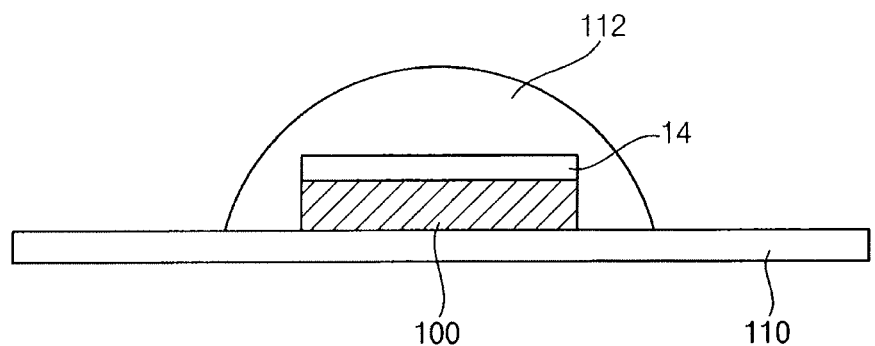
FIGS. 7A to 7C illustrate cross-sectional views of light emitting devices in accordance with example embodiments.
Figure 7B:
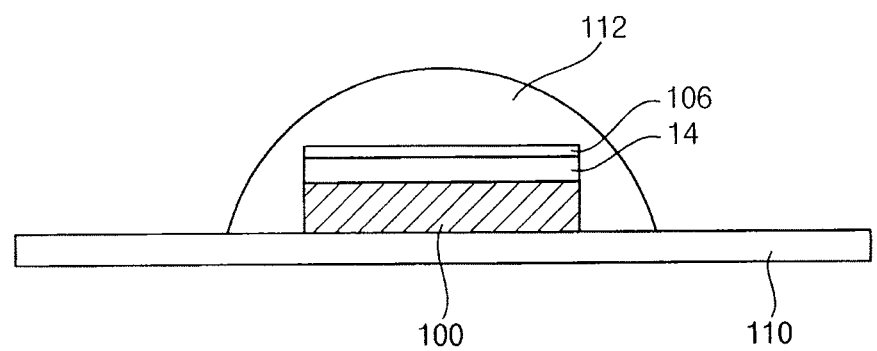
Figure 7C:
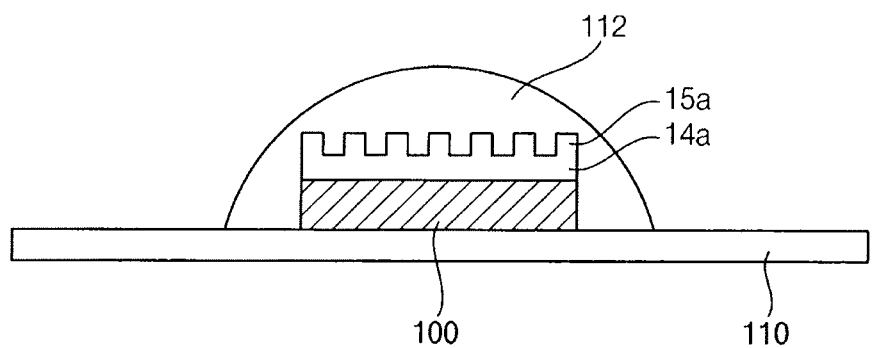

FIGS. 7A to 7C illustrate cross-sectional views of light emitting devices in accordance with example embodiments.

Referring to FIG. 7A, the light emitting device may include a printed circuit board (PCB) 110, a light emitting element 100, a single crystal fluorescent film 14, and a lens 112. The PCB 110 may include circuits such as a driving IC, a power connector, and a protection device, etc. The light emitting element 100 may be mounted on the PCB 110. The light emitting element 100 may be substantially the same as that illustrated with reference to FIG. 5A.

The single crystal fluorescent film 14 may be formed on the upper surface of the light emitting element 100. The single crystal fluorescent film 14 may completely cover the upper surface of the light emitting element 100. In an implementation, upper and lower surfaces of the single crystal fluorescent film 14 may be flat, as illustrated with reference to FIG. 2A.

The lens 112 may be formed on the PCB 110 to cover the light emitting element 100 and the single crystal fluorescent film 14. An upper surface of the lens 112 may have a hemi-spherical shape.

The lens 112 may uniformly diffuse a light radiated from the single crystal fluorescent film 14 in a radial direction. The lens 112 may include a transparent silicone resin. The lens 112 may serve as an encapsulant for covering a structure including the light emitting element 100 and the single crystal fluorescent film 14.

The light emitting device may include the single crystal fluorescent film 14, so that the light emitting device having high power may be manufactured. The light emitting device may have a chip on board (COB) structure.

In an implementation, as shown in FIG. 7B, the light emitting device may further include an anti-reflection coating layer 106 on the single crystal fluorescent film 14.

In an implementation, as shown in FIG. 7C, protruding patterns 15*a* may be further formed on a surface of the single crystal fluorescent film 14*a* in the light emitting device. For example, the single crystal fluorescent film 14*a* may use one of those illustrated with reference to FIGS. 2C and 2D. An anti-reflection coating layer may be further formed on the single crystal fluorescent film including the protruding patterns 15*a*.

Figure 8A:
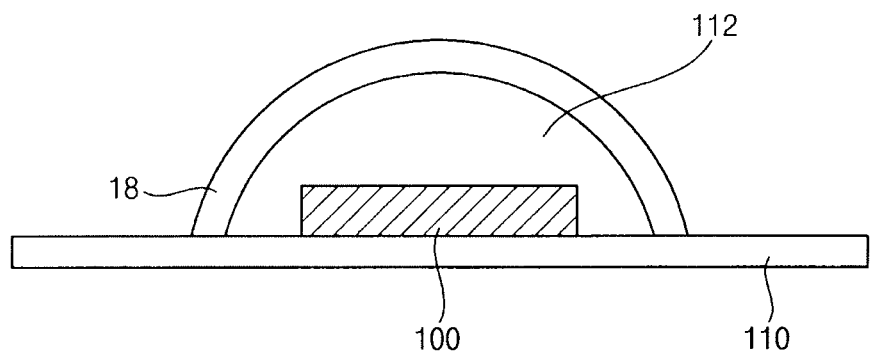
FIGS. 8A to 8C illustrate cross-sectional views of light emitting devices in accordance with example embodiments.
Figure 8B:
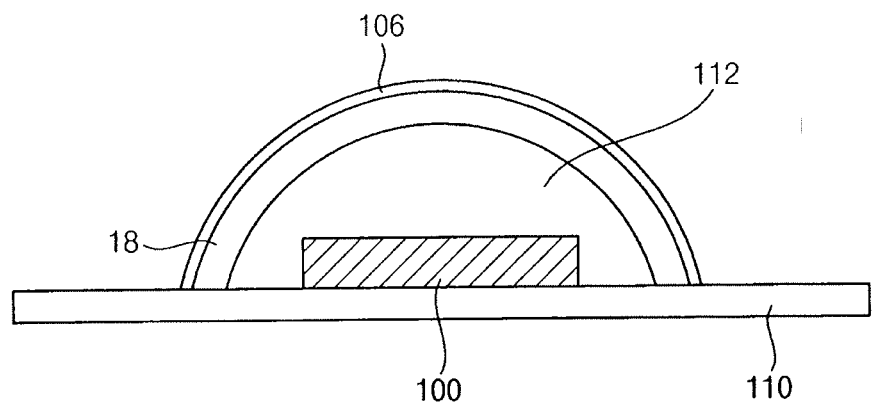
Figure 8C:
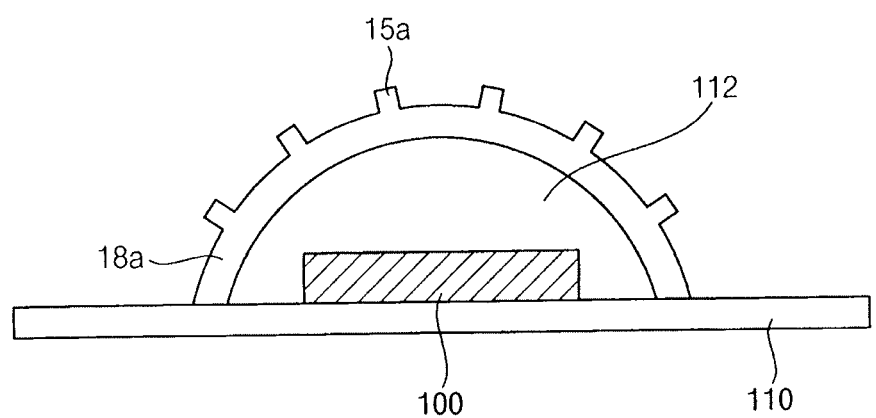

FIGS. 8A to 8C illustrate cross-sectional views of light emitting devices in accordance with example embodiments.

Referring to FIG. 8A, the light emitting device may include a PCB 110, a light emitting element 100, a single crystal fluorescent film 18, and a lens 112.

The light emitting element 100 may be mounted on the PCB 110.

The lens 112 may be formed on the PCB 110 to cover the light emitting element 100. Thus, the lens 112 may serve as an encapsulant of the light emitting element 100. An upper surface of the lens 112 may have a hemi-spherical shape.

The single crystal fluorescent film 18 may cover the upper surface of the lens 112.

In an implementation, a lower surface of the single crystal fluorescent film 18 may have a surface profile substantially the same as (e.g., conforming or complementary to) a surface profile of the upper surface of the lens 112. Thus, the lower surface of the single crystal fluorescent film 18 may have a hemi-spherical shape. Also, the upper surface of the single crystal fluorescent film 18 may have a hemi-spherical shape. For example, the single crystal fluorescent film 18 may be substantially the same as that illustrated with reference to FIG. 4A.

Referring to FIG. 8B, an anti-reflection coating layer 106 may be further formed on the single crystal fluorescent film 18.

The light emitting device may have a remote structure in which the single crystal fluorescent film 18 and the light emitting element 100 are spaced apart from each other.

In an implementation, as shown in FIG. 8C, the single crystal fluorescent film 18a included in the light emitting device may include a protruding pattern 15a on an upper surface thereof. For example, the single crystal fluorescent film 18a may use one of those illustrated with reference to FIGS. 4B and 4D. Also, an anti-reflection coating layer may be further formed on the single crystal fluorescent film 18a including the protruding patterns 15a.

Figure 9:
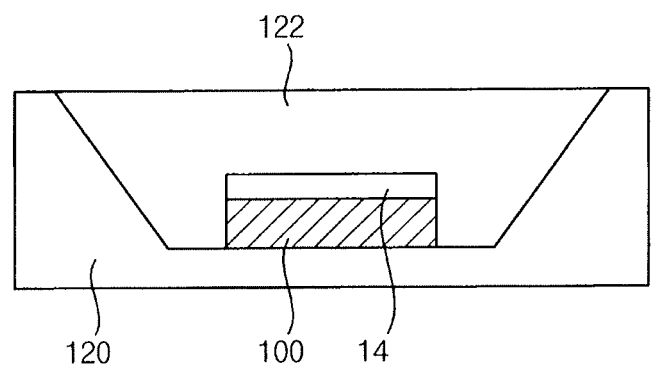
FIG. 9 illustrates a cross-sectional view of a light emitting device in accordance with example embodiments.

FIG. 9 illustrates a cross-sectional view of a light emitting device in accordance with example embodiments.

Referring to FIG. 9, the light emitting device may include a cup-shaped frame 120, a light emitting element 100, a single crystal fluorescent film 14, and an encapsulant 122.

The light emitting element 100 may be on a bottom of the cup-shaped frame 120. The single crystal fluorescent film 14 may completely cover an upper surface of the light emitting element 100. As illustrated with reference to FIG. 2A, upper and lower surfaces of the single crystal fluorescent film 14 may be flat.

The encapsulant 122 may fill an inner space of the frame 120 to cover the stacked structure including the light emitting element 100 and the single crystal fluorescent film 14. The encapsulant 122 may include a thermosetting resin. The encapsulant 122 may include, e.g., a transparent resin such as a silicone resin or an epoxy resin.

In an implementation, an anti-reflection coating layer may be further formed on the single crystal fluorescent film 14.

In an implementation, the single crystal fluorescent film 14 included in the light emitting device may include protruding patterns on an upper surface thereof. For example, the single crystal fluorescent film 14 may use one of those illustrated with reference to FIGS. 2C and 2D. Also, an anti-reflection coating layer may be further included on the single crystal fluorescent film 14 including the protruding patterns.

Figure 10:
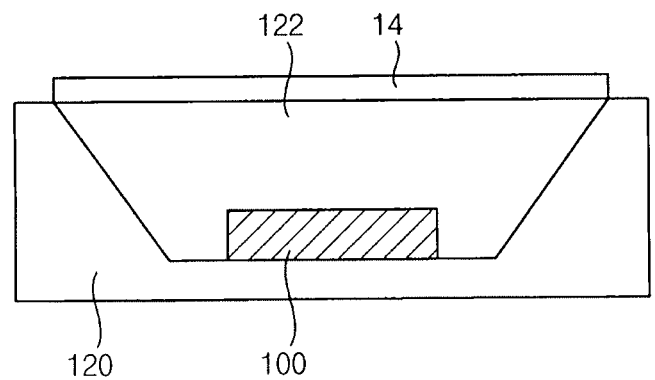
FIG. 10 illustrates a cross-sectional view of a light emitting device in accordance with example embodiments.

FIG. 10 illustrates a cross-sectional view of a light emitting device in accordance with example embodiments.

Referring to FIG. 10, the light emitting device may include a cup-shaped frame 120, a light emitting element 100, a single crystal fluorescent film 14, and an encapsulant 122. The light emitting element 100 may be on a bottom portion of an inner space of the frame 120. The encapsulant 122 may fills the inner space of the frame 120 to cover the light emitting element 100. The encapsulant 122 may include a thermosetting resin. The encapsulant 122 may include, e.g., a transparent resin such as a silicone resin or an epoxy resin.

The single crystal fluorescent film 14 may completely cover an upper surface of the encapsulant 122. As illustrated with reference to FIG. 2A, upper and lower surfaces of the single crystal fluorescent film 14 may be a flat.

In an implementation, an anti-reflection coating layer may be formed on the single crystal fluorescent film 14. The light emitting device may have a remote structure in which the single crystal fluorescent film 14 and the light emitting element 100 may be spaced apart from each other.

In an implementation, as described with reference to FIGS. 2B to 2D, one of the single crystal fluorescent films 14a, 14b, and 14c including protruding patterns may be used in the light emitting device. In an implementation, an antireflection coating layer may be further formed on the single crystal fluorescent film including the protruding patterns.

Phosphor Powder

In an implementation, a fluorescent film may include single crystal phosphor powders or polycrystalline powders represented by the above-described Formula (1).

In an implementation, the single crystal phosphor powders may be formed by following method.

A single crystal phosphor ingot 10 may be formed as illustrated with reference to FIG. 1. (S10, S12) A single crystal phosphor ingot 10 may be sliced in a horizontal direction to form a wafer-shaped single crystal phosphor 12. The wafer-shaped single crystal phosphor 12 may be cut to have a desired size. Selectively, crushing of the single crystal phosphor 12 may be further performed. In an implementation, a surface treatment such as grinding and polishing, etc., may be further performed.

The single crystal phosphor may be cut or crushed in a crystal direction, and thus the single crystal phosphor powders may have a uniform size. In an implementation, sizes of the single crystal phosphor powders may have a quartile deviation (QD, d75-d25/2) less than about 2.0. For example, the sizes of the single crystal phosphor powders may have a QD value of about 0.5 to about 1.

If sizes of the single crystal phosphor powders were to be uneven, characteristics of a fluorescent film including the single crystal phosphor powders may not be uniform. Thus, when the light emitting device including the fluorescent film is operated, light loss due to scattering could occur at fine particle regions of the fluorescent film, and color scattering could occur at large particle regions of the fluorescent film. According to an embodiment, the sizes of the single crystal phosphor powders may be uniform, the fluorescent film including the single crystal phosphor powders may have uniform characteristics, and the light loss and/or the color scattering may decrease.

In addition, a scattering coefficient and the color scattering may vary depending on the size of the single crystal phosphor powder. For example, when the sizes of the single crystal phosphor powders are 20 μm or less, the scattering coefficient may have a maximum value. Also, when the sizes of the single crystal phosphor powders are grater than 20 μm, a difference of the scattering coefficient may not be great according to sizes of the single crystal phosphor powders. If the single crystal phosphor powders are greater than 500 μm, the powders included in the fluorescent film may be precipitated, and thus the color scattering may occur. In an implementation, each of the single crystal phosphor powders may have a size in a range of about 20 μm to about 500 μm.

In an implementation, the single crystal phosphor powder may have a cuboid shape or a cubic shape. For example, a single crystal phosphor having a wafer shape may be cut to have a uniform size in the range of about 20 μm to about 500 μm (e.g., a side of the cube or other dimension thereof may be about 20 μm to about 500 μm). Thus, each of the single crystal phosphor powders may have a cubic shape.

In an implementation, each of the single crystal phosphor powders may have a spherical shape. For example, a single crystal phosphor having a wafer shape may be cut to have a uniform size in the range of about 20 μm to about 500 μm. Thus, each of the single crystal phosphor powders may have a cubic shape. Then, a surface treatment such as a polishing process may be performed on the single crystal phosphor powders to form spherical single crystal phosphor powders.

The polycrystalline phosphor powders may be manufactured by the following method.

As described above, a polycrystalline phosphor ingot may be formed. The polycrystalline phosphor ingot may be sliced in the horizontal direction to form a flat polycrystalline phosphor. Then, the flat polycrystalline phosphor may be cut to have a desired size. Selectively, a crushing of the polycrystalline phosphor may be further performed. Further, a surface treatment such as grinding and polishing, etc., may be performed.

As the polycrystalline phosphor powders may be formed by cutting to have a target size, the polycrystalline phosphor powders may have a uniform size. In an implementation, the sizes of the polycrystalline phosphor powders may have a QD less than about 2.0. For example, the sizes of the polycrystalline phosphor powders may have a QD value of about 0.5 to about 1.

Each of the polycrystalline phosphor powders may have a uniform size in a range of about 20 μm to about 500 μm.

In an implementation, each of the polycrystalline phosphor powders may have a cuboid shape or a cubic shape. For example, the flat polycrystalline phosphor may be cut to have a uniform size within a range of 20 μm to 500 μm, so that cubic polycrystalline phosphor powders may be formed.

In an implementation, each of the polycrystalline phosphor powders may have a spherical shape. For example, the flat polycrystalline phosphor may be cut to have a uniform size within a range of 20 μm to 500 μm, so that cubic polycrystalline phosphor powders may be formed. Then, a surface treatment such as a polishing process may be performed on the polycrystalline phosphor powders to form spherical polycrystalline phosphor powders.

Hereinafter, the fluorescent film may include single crystal phosphor powders or polycrystalline phosphor powders. Also, only the fluorescent film including the single crystal phosphor powders may be described, however the polycrystalline fluorescent film may be applied in the same manner as the single crystal fluorescent film.

Figure 11A:
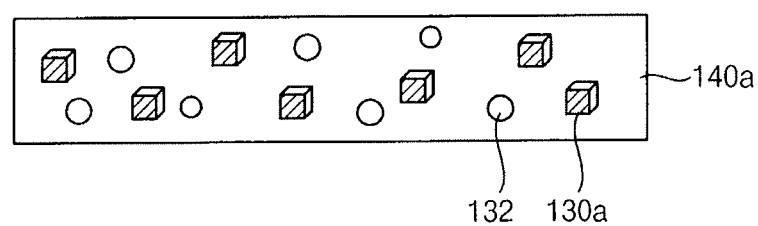
FIGS. 11A and 11B illustrate cross-sectional views of fluorescent films in accordance with example embodiments.
Figure 11B:
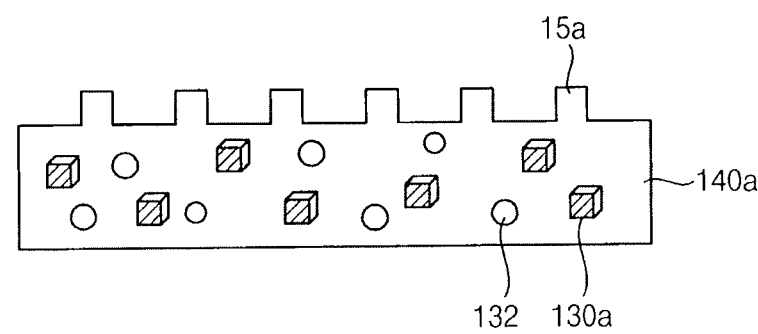

FIGS. 11A and 11B illustrate cross-sectional views of fluorescent films in accordance with example embodiments.

Referring to FIG. 11A, the fluorescent film 140a may have a PIG (phosphor in glass) structure in which single crystal phosphor powders 130a having a cubic shape may be dispersed in a glass.

In an implementation, the fluorescent film 140a may have a structure in which single crystal phosphor powders 130a having a cubic shape may be dispersed in a silicon film. As described above, the single crystal phosphor powders 130a may have a uniform size.

In an implementation, the glass or the silicon film may further include red phosphor powder 132 for emitting red light. As characteristics of the red phosphor powder 132 may not be greatly changed according to sizes of the red phosphor powder 132, the red phosphor powder 132 may not have a uniform size.

The single crystal phosphor powders 130a may emit light having a peak intensity at a wavelength of 500 nm to 600 nm. For example, the blue light emitted from the light emitting element 100 may be absorbed to emit yellow light.

In an implementation, as shown in FIG. 11B, the fluorescent film 140a may further include protruding patterns 15a. The protruding patterns 15a may have a cross-sectional shape substantially the same as one of those illustrated with reference to FIGS. 2A to 2D. The protruding patterns 15a may be formed by performing a texturing process. The texturing process may include, e.g., etching, laser cutting, planing, grinding, sandblasting, etc.

Figure 12A:
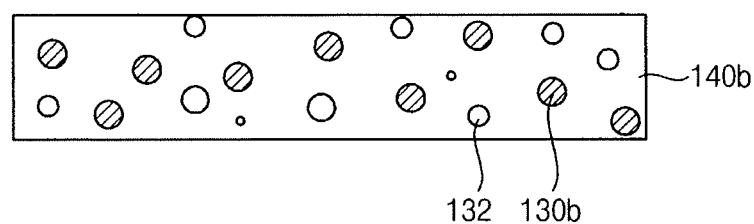
FIGS. 12A and 12B illustrate cross-sectional views of fluorescent films in accordance with example embodiments.
Figure 12B:
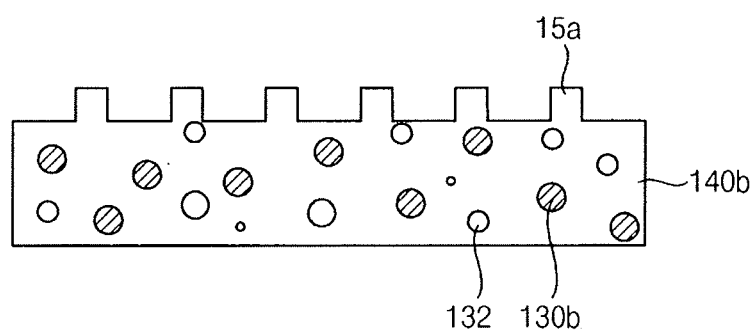

FIGS. 12A and 12B illustrate cross-sectional views of fluorescent films in accordance with example embodiments.

Referring to FIG. 12A, the fluorescent film 140b may be formed of a PIG structure in which single crystal phosphor powders 130b having a spherical shape may be dispersed in glass. In an implementation, the fluorescent film 140b may have a structure in which single crystal phosphor powders having a spherical shape may be dispersed in a silicon film. As described above, the single crystal phosphor powders 130b may have a uniform size.

In an implementation, the glass or silicon film may further include red phosphor powder 132 for emitting red light. As characteristics of the red phosphor powder 132 may not be greatly changed according to sizes of the red phosphor powder 132, the red phosphor powder 132 may not have a uniform size.

In an implementation, as shown in FIG. 12B, the fluorescent film 140b may further include protruding patterns 15a. The protruding patterns 15a may have a cross-sectional shape substantially the same as one of those illustrated with reference to FIGS. 2A to 2D. The protruding patterns 15a may be formed by performing a texturing process. The texturing process may include, e.g., etching, laser cutting, planing, grinding, sandblasting, etc.

The fluorescent film may be used for each of the light emitting devices having various structures described above.

Hereinafter, each fluorescent film included in the light emitting device may include single crystal phosphor powders or polycrystalline phosphor powders. Hereinafter, only the phosphor film including the single crystal phosphor powders may be described, however a phosphor film including the polycrystalline phosphor powders may be applied in the same manner as the phosphor film including the single crystal phosphor powders.

Figure 13:
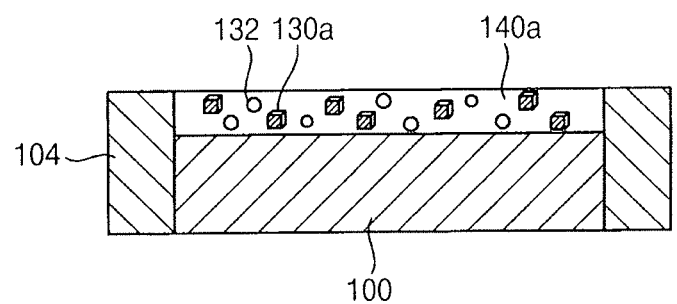
FIG. 13 illustrates a cross-sectional view of a light emitting device in accordance with example embodiments.

FIG. 13 illustrates a cross-sectional view of a light emitting device in accordance with example embodiments.

Referring to FIG. 13, the light emitting device may include a light emitting element 100 that emits blue light as illustrated with reference to FIG. 5A, and a fluorescent film 140a. The fluorescent film 140a may absorb the blue light and may emit light of a wavelength different from wavelength of the blue light. In an implementation, the light emitting device may further include a reflection plate 104.

In an implementation, the fluorescent film may be used in one of the fluorescent films as illustrated with reference to FIG. 11A and FIG. 11B. In an implementation, the fluorescent film may be used in one of the fluorescent films as illustrated with reference to FIG. 12A and FIG. 12B.

In an implementation, protruding patterns may be formed on an upper surface of the fluorescent film 140a. In this case, the protruding patterns may have a cross-sectional shape as one of those illustrated with reference to FIGS. 2A to 2D. As the protruding patterns are formed, an emitting efficiency of the light emitting device may increase.

In an implementation, an anti-reflection coating layer may be further formed on the fluorescent films.

Sizes of the single crystal phosphor powders in the fluorescent film may be uniform, and light loss and/or color scattering of the light emitting device including the fluorescent film may be reduced.

In an implementation, one of the light emitting devices illustrated with reference to 5B, 5C, 6A, 6B, 6C, 7A, 7B, 7C and 10 may include one of the fluorescent films illustrated with the illustrated with reference to 11A, 11B, 12A, and 12B.

Hereinafter, a light emitting device using phosphor powders may be described, and the phosphor powders may include single crystal phosphor powders or polycrystalline phosphor powders. Hereinafter, only the single crystal phosphor powders may be described, however the polycrystalline phosphor powders may be applied in the same manner as single crystal phosphor powders.

Light emitting device using phosphor powders

Figure 14:
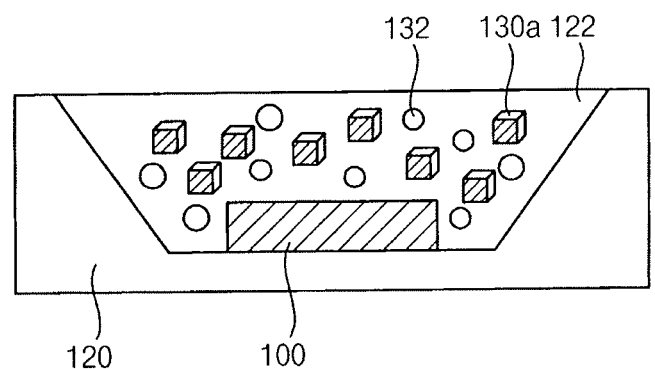
FIG. 14 illustrates a cross-sectional view of a light emitting device in accordance with example embodiments.

FIG. 14 illustrates a cross-sectional view of a light emitting device in accordance with example embodiments.

Referring to FIG. 14, the light emitting device may include a cup-shaped frame 120 having an inner space, a light emitting element 100, and an encapsulant 122 including phosphor powders 130a and 132. The phosphor powder may include a single crystal phosphor powder 130a. In an implementation, the phosphor powder may further include a red phosphor powder 132 that emits red light.

The single crystal phosphor powder 130a may have a cubic shape.

The single crystal phosphor powder 130a may have the same properties as those described above. For example, each of the single crystal phosphor powders 130a may have a size within a range of 20 μm to 500 μm, and the single crystal phosphor powders 130a may have a quartile deviation of less than 2.0. The light emitting element 100 may be on a bottom portion of the inner space of the frame 120. The encapsulant 122 may include a thermosetting resin. For example, the encapsulant 122 may include a silicone resin.

For forming the encapsulant 122 including the phosphor powders 130a and 132, a dispersion process of mixing the single crystal phosphor powder 130a and encapsulant 122 to form dispersion liquid may be performed. In an implementation, when the dispersion process is performed, the encapsulant 122 may further include a phosphor powder that emits light having a wavelength different from that of the single crystal phosphor powder 130a. In this case, the encapsulant 122 may include the single crystal phosphor powder 130a and the red phosphor powder 132. The encapsulant 122 including the phosphor powders 130a and 132 may be formed by filling the dispersion liquid in the inner space of the frame 120 and heating the dispersion liquid.

In an implementation, an anti-reflection coating layer may be formed on the encapsulant 122.

As described above, the single crystal phosphor powders 130a including the encapsulant 122 may have a uniform size, so that light loss and color scattering of the light emitting device may decrease.

Figure 15:
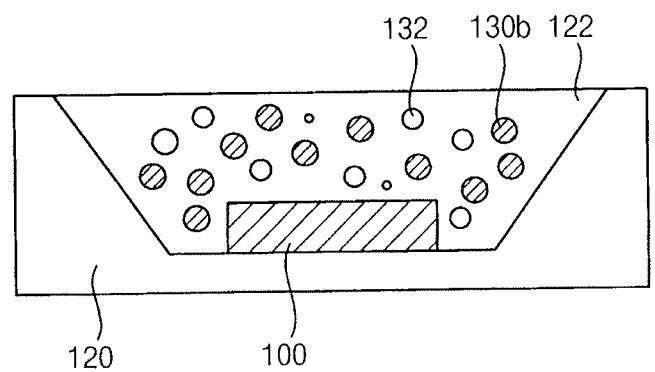
FIG. 15 illustrates a cross-sectional view of a light emitting device in accordance with example embodiments.

FIG. 15 illustrates a cross-sectional view of a light emitting device in accordance with example embodiments. Referring to FIG. 15, the light emitting device may include a cup-shaped frame 120 having an inner space, an encapsulant 122 including a light emitting element 100 and phosphor powders 130b and 132.

The phosphor powder may include a single crystal phosphor powder 130b.

The light emitting device shown in FIG. 15 may be substantially the same as the light emitting device shown in FIG. 14 except for the single crystal phosphor powder 130b having a spherical shape.

In an implementation, an anti-reflection coating may be further formed on the encapsulant 122.

The single crystal phosphor powders 130b included in the encapsulant 122 may have a uniform size, and light loss and color scattering in the light emitting device may decrease.

By way of summation and review, a size variation of yellow phosphor powders included in the yellow phosphor structure may be great, and light loss and color scattering due to a light scattering could occur in the light emitting device. Further, for manufacturing of light emitting device having a high power, the yellow phosphor structure may have a high thermal conductivity.

One or more embodiments may provide a light emitting device including a single crystal phosphor or polycrystalline phosphor.

One or more embodiments may provide a light emitting device having reduced light loss, improved color scattering, and high thermal conductivity.

According to example embodiments, the light emitting device may include a fluorescent film including a single crystal or a polycrystalline phosphor material. In an implementation, the light emitting device may include a phosphor structure including a single crystal phosphor powder having a uniform size. Therefore, in the light emitting device, light loss and color scattering may decrease. Further, as the fluorescent film may have high thermal conductivity, the light emitting device including the fluorescent film may be used in high output product.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light emitting device, comprising:
a light emitting element for emitting blue light; and
a fluorescent film including a single crystal phosphor powder dispersed in a glass or a silicon film,
wherein the fluorescent film absorbs the blue light and emits light having a wavelength different from that of the blue light,
wherein the fluorescent film faces a surface of the light emitting element, and the single crystal phosphor powder included in the fluorescent film is represented by the following Formula (1):

$Y_{3-x-y}L_xM_yAl_5O_{12}$ wherein L is Gd or Lu, and M is Ce, Tb, Eu, Yb, Pr, Tm, or Sm, $0 \leq x \leq 2.999$, and $0.001 \leq y \leq 0.1$, and
wherein particles of the single crystal phosphor powder have a size in a range of 20 μm to less than 500 μm.

2. The light emitting device as claimed in claim 1, wherein the fluorescent film emits light having a peak intensity at a wavelength of 500 nm to 600 nm.

3. The light emitting device as claimed in claim 1, wherein the fluorescent film:
has a flat plate shape.

4. The light emitting device as claimed in claim 1, wherein each particle of the single crystal phosphor powder has a cuboid shape, a cubic shape, or a spherical shape.

5. The light emitting device as claimed in claim 1, wherein sizes of the single crystal phosphor powder have a quartile deviation (QD) less than 2.0.

6. The light emitting device as claimed in claim 1, wherein the fluorescent film further includes red phosphor powder for emitting red light in the glass or silicon film.

7. The light emitting device as claimed in claim 1, further comprising a reflection plate, wherein:
the fluorescent film is attached on an upper surface of the light emitting element, and the reflection plate is attached on a sidewall of the light emitting element and a sidewall of the fluorescent film.

8. The light emitting device as claimed in claim 1, wherein the fluorescent film is attached on an upper surface and a sidewall of the light emitting element.

9. The light emitting device as claimed in claim 1, further comprising a printed circuit board, wherein:
the light emitting element is on the printed circuit board,
the fluorescent film contacts an upper surface of the light emitting element,
the printed circuit board includes a lens thereon covering the light emitting element and the fluorescent film, and
a surface of the lens has a hemi-spherical shape.

10. The light emitting device as claimed in claim 1, further comprising a circuit board, wherein:
the light emitting element is on the circuit board,
the circuit board includes a lens thereon covering the light emitting element,
the lens has a hemi-spherical shape, and
the fluorescent film is on an upper surface of the lens.

11. The light emitting device as claimed in claim 1, wherein an upper surface of the fluorescent film includes protruding patterns.

12. The light emitting device as claimed in claim 1, further comprising an anti-reflection coating layer on an upper surface of the fluorescent film.

13. The light emitting device as claimed in claim 12, wherein the anti-reflection coating layer includes a material having a refractive index that is between a refractive index of the fluorescent film and a refractive index of air.

14. A light emitting device, comprising:
a light emitting element for emitting blue light; and
a single crystal fluorescent material, the single crystal fluorescent material including an encapsulant and a single crystal fluorescent powder,
wherein the single crystal fluorescent material absorbs the blue light and emits light having a wavelength different from that of the blue light, and
wherein the single crystal fluorescent material faces a surface of the light emitting element, and particles of the single crystal fluorescent powder have a quartile deviation (QD) less than 2.0,
wherein particles of the single crystal fluorescent powder are represented by the following Formula (1):

$$Y_{3-x-y}L_xM_yAl_5O_{12}$$

wherein L is Gd or Lu, and M is Ce, Tb, Eu, Yb, Pr, Tm, or Sm, $0 \leq x \leq 2.999$, and $0.001 \leq y \leq 0.1$, and
wherein particles of the single crystal phosphor powder have a size in a range of 20 μm to less than 500 μm.

15. A light emitting device, comprising:
a light emitting element for emitting blue light;
a fluorescent film including a single crystal phosphor powder dispersed in a glass or a silicon film, the fluorescent film contacting an upper surface of the light emitting element, wherein the fluorescent film absorbs the blue light and emits light having a wavelength different from that of the blue light; and
a reflection plate attached on a sidewall of the light emitting element and a sidewall of the fluorescent film,
wherein the single crystal phosphor powder included in the fluorescent film is represented by the following Formula (1):

$$Y_{3-x-y}L_xM_yAl_5O_{12}$$

wherein L is Gd or Lu, and M is Ce, Tb, Eu, Yb, Pr, Tm, or Sm, $0 \leq x \leq 2.999$, and $0.001 \leq y \leq 0.1$, and
wherein particles of the single crystal phosphor powder have a size in a range of 20 μm to less than 500 μm.

16. The light emitting device as claimed in claim 15, wherein:
the fluorescent film completely covers the upper surface of the light emitting element, and
the sidewall of the fluorescent film is orthogonal with respect to an upper surface and a lower surface of the fluorescent film.

17. The light emitting device as claimed in claim 15, wherein:
the fluorescent film completely covers the upper surface of the light emitting element, and
a sidewall of the fluorescent film is inclined relative to an upper surface and a lower surface of the fluorescent film, a size of the upper surface of the fluorescent film being different from a size of the lower surface of the fluorescent film.

\* \* \* \* \*